United States Patent
Lee et al.

(10) Patent No.: US 10,597,781 B2
(45) Date of Patent: Mar. 24, 2020

(54) METHOD FOR FORMING COATING FILM HAVING HIGH HEAT RESISTANCE, HIGH HARDNESS AND ABRASION RESISTANCE, COATING FILM HAVING HIGH HEAT RESISTANCE, HIGH HARDNESS AND ABRASION RESISTANCE, AND CUTTING TOOL COMPRISING SAME

(71) Applicant: PUSAN NATIONAL UNIVERSITY INDUSTRY-UNIVERSITY COOPERRATION FOUNDATION, Busan (KR)

(72) Inventors: Hee Soo Lee, Busan (KR); Seol Jeon, Gyeongsangnam-do (KR); Ji Seung Ryu, Busan (KR); Bu Young Kim, Gyeongsangnam-do (KR); Seung Hyeon Jo, Busan (KR); Eun Pyo Hong, Busan (KR); Yang Do Kim, Busan (KR); Hyun Jo Yoo, Busan (KR)

(73) Assignee: Pusan National University Industry-University Cooperation Foundation, Busan (KR)

( * ) Notice: Subject to any disclaimer, the term of this patent is extended or adjusted under 35 U.S.C. 154(b) by 0 days.

(21) Appl. No.: 16/081,660

(22) PCT Filed: Mar. 2, 2017

(86) PCT No.: PCT/KR2017/002254
§ 371 (c)(1),
(2) Date: Aug. 31, 2018

(87) PCT Pub. No.: WO2017/150908
PCT Pub. Date: Sep. 8, 2017

(65) Prior Publication Data
US 2019/0093228 A1 Mar. 28, 2019

(30) Foreign Application Priority Data

Mar. 2, 2016 (KR) .................. 10-2016-0024989
Aug. 3, 2016 (KR) .................. 10-2016-0099072

(51) Int. Cl.
*C21D 1/09* (2006.01)
*C23C 14/06* (2006.01)
(Continued)

(52) U.S. Cl.
CPC .......... *C23C 16/515* (2013.01); *B26D 1/0006* (2013.01); *B32B 27/14* (2013.01);
(Continued)

(58) Field of Classification Search
None
See application file for complete search history.

(56) References Cited

U.S. PATENT DOCUMENTS 4,459,458 A * 7/1984 Vetsch .................. B23P 25/003
219/121.6

FOREIGN PATENT DOCUMENTS

FR 2592063 A1 * 6/1987 ......... C23C 14/0015
JP 59179776 10/1984
(Continued)

OTHER PUBLICATIONS

Ted Pella. Inc., "PELCO® Conductive Graphite Isopropanol Based" [online, first cached on Aug. 12, 2010], available at www.tedpella.com/technote_html/16053%20TN.pdf (Year: 2010).*
(Continued)

*Primary Examiner* — Jose Hernandez-Kenney
(74) *Attorney, Agent, or Firm* — Norton Rose Fulbright US LLP (57) ABSTRACT

The present disclosure relates to a method for producing a coating film having high heat resistance, high hardness and
(Continued)

wear resistance, a coating film having high heat-resistance, high hardness and wear resistance produced using the method, and a cutting tool including the same. The method includes forming a metal nitride layer on a metal base; forming a carbon layer on the metal nitride layer; and irradiating a laser into the carbon layer to add carbons into a portion of the metal nitride layer, thereby to form a carburized layer.

10 Claims, 7 Drawing Sheets

(51) Int. Cl.

| | | |
|---|---|---|
| *C23C 16/32* | (2006.01) | |
| *C23C 16/36* | (2006.01) | |
| *C23C 16/515* | (2006.01) | |
| *C23C 28/00* | (2006.01) | |
| *C23C 8/64* | (2006.01) | |
| *B32B 27/14* | (2006.01) | |
| *C23C 8/66* | (2006.01) | |
| *C23C 14/35* | (2006.01) | |
| *C23C 14/58* | (2006.01) | |
| *C23C 28/04* | (2006.01) | |
| *B26D 1/00* | (2006.01) | |
| *C23C 16/34* | (2006.01) | |
| *C23C 30/00* | (2006.01) | |
| *B62D 1/00* | (2006.01) | |

(52) U.S. Cl.
CPC .............. *C21D 1/09* (2013.01); *C23C 8/64* (2013.01); *C23C 8/66* (2013.01); *C23C 14/0641* (2013.01); *C23C 14/35* (2013.01); *C23C 14/5846* (2013.01); *C23C 16/32* (2013.01); *C23C 16/34* (2013.01); *C23C 16/36* (2013.01); *C23C 28/042* (2013.01); *C23C 28/322* (2013.01); *C23C 28/34* (2013.01); *C23C 28/341* (2013.01); *C23C 30/005* (2013.01)

(56) References Cited

FOREIGN PATENT DOCUMENTS

| | | | |
|---|---|---|---|
| JP | 2540904 | 10/1996 | |
| JP | 09-041125 | 2/1997 | |
| KR | 10-0154327 | 11/1998 | |
| KR | 10-0182289 | 5/1999 | |
| WO | WO-2014172442 A1 * | 10/2014 | ............. C23C 24/04 |

OTHER PUBLICATIONS

Saleh et al. "Surface carburizing of Ti—6Al—4V alloy by laser melting". Optics and Lasers in Engineering 48 (2010). pp. 257-267 (Year: 2010).*

International Search Report and Written Opinion Issued in Corresponding PCT Application No. PCT/KR2017/002254, dated May 10, 2017.

* cited by examiner

METHOD FOR FORMING COATING FILM HAVING HIGH HEAT RESISTANCE, HIGH HARDNESS AND ABRASION RESISTANCE, COATING FILM HAVING HIGH HEAT RESISTANCE, HIGH HARDNESS AND ABRASION RESISTANCE, AND CUTTING TOOL COMPRISING SAME

This application is a national phase under 35 U.S.C. § 371 of International Application No. PCT/KR2017/002254, filed Mar. 2, 2017, which claims the benefit of priority to Korean Patent Application Serial No. 10-2016-0024989, filed Mar. 2, 2016 and Korean Patent Application Serial No. 10-2016-0099072, filed Aug. 3, 2016. The entire contents of each of the referenced applications are incorporated into the present application by reference.

BACKGROUND

Field of the Present Disclosure

The present disclosure relates to a method for producing a coating film having high heat resistance, high hardness and wear resistance, a coating film having high heat-resistance, high hardness and wear resistance produced using the method, and a cutting tool including the same.

Discussion of Related Art

Recently, due to the increasing frequency of use of difficulty-to-cut material due to the alloying of metal materials and the development of composites, the machining process requires a high speed dry cutting process that excludes the use of cutting oil or cooling water. Since a cutting tool used for high-speed dry machining of such a difficulty-to-cut material should have high hardness and thermal shock resistance, ceramic based high hardness coating is introduced on the surface of the cutting tool to extend the life of the cutting tool.

Titanium-based nitride widely used among the ceramic materials used for high hardness coating has the advantage of high hardness due to covalent bonding and high adhesion to the metal base. In addition to TiN (titanium nitride), which is a basic form of titanium nitride, addition of light elements such as carbon and boron to TiN and/or replacement of transition metals such as aluminum, zirconium, and chromium with titanium sites may improve the thermal and mechanical properties of the titanium nitride. Particularly, among these modifications of the titanium nitrides, TiZrN coatings having particularly excellent phase stability at high temperature and high pressure are widely used.

Under the high speed dry machining process, not only the mechanical pressure applied to the cutting tool is increased, but also the surface temperature between the tool and the workpiece rises by about 1,000° C. or higher. In such an environment, when a coating layer having high hardness is not stably formed on the surface of the cutting tool, there is a problem that the machining precision of the workpiece and the life of the cutting tool itself are reduced. The titanium-based nitride undergoes problems such as surface deterioration and coating layer peeling due to the lattice expansion due to the oxidation of TiN to titanium dioxide (TiO and due to the phase change therefrom.

Recently, an ultra-high hardness thin film using a new material such as cubic boron nitride (cBN) has been reported to have a very high hardness, but poor adhesion to the metal base. Further, when zirconium, a transition metal, is added to the TiZrN coating, the thermal shock resistance of the coating is improved. Further, studies for improving the surface mechanical properties such as surface hardness and friction coefficient for easily cutting various difficulty-to-cut materials continue.

SUMMARY

Technical Purpose

The purpose of the present disclosure is to provide a method for producing a coating film having high thermal shock resistance and improved surface hardness and wear resistance.

Another purpose of the present disclosure is to provide a coating film having high heat resistance, high hardness and wear resistance.

Still another object of the present disclosure is to provide a cutting tool comprising a coating film having high heat-resistance, high hardness and wear-resistance.

Technical Solution

In one aspect of the present disclosure, there is provided a method for producing a coating film having high heat resistance, high hardness and wear resistance, the method comprising: forming a metal nitride layer on a metal base; forming a carbon layer on the metal nitride layer; and irradiating a laser into the carbon layer to add carbons into a portion of the metal nitride layer, thereby to form a carburized layer.

In one embodiment of the method, the metal nitride layer includes titanium and (Ti) and at least one of zirconium (Zr) and chromium (Cr).

In one embodiment of the method, forming the carburized layer includes irradiating a pulse or continuous wave laser into the carbon layer.

In one embodiment of the method, the carburized layer includes titanium carbide (TiC).

In one embodiment of the method, the carburized layer includes a high carbon content portion; and a low carbon content portion disposed between a portion of the metal nitride layer remaining after the carburization and the high carbon content portion, wherein the low carbon content portion has a smaller carbon content per unit area than a carbon content per unit area of the high carbon content portion. In one embodiment of the method, the high carbon content portion comprises titanium carbide (TiC).

In one embodiment of the method, the method further comprises removing a portion of the carbon layer remaining after forming the carburized layer.

In one embodiment of the method, the carbon layer is made of graphite or carbon nanotube (CNT).

In one embodiment of the method, forming the carbon layer includes coating a carbon paste containing a carbon material, a binder and a solvent on the metal nitride layer.

In one embodiment of the method, when the carbon material is graphite, a size of graphite is 1 nm or larger, and is 20 μm or smaller.

In one embodiment of the method, the method further includes forming a titanium layer on the metal base prior to forming the metal nitride layer, wherein in forming the metal nitride layer, the titanium layer is nitrided to form an adhesion improving layer made of titanium nitride (TiN).

In another aspect of the present disclosure, there is provided a coating film having high heat-resistance, high hardness and low friction, the film comprising: a metal nitride layer formed on a metal base and containing at least one of zirconium (Zr) and chromium (Cr) and titanium (Ti); and a carburized layer disposed on the metal nitride layer and including carburized metal nitride.

In one embodiment of the coating film, the carburized layer includes titanium carbide (TiC).

In one embodiment of the coating film, the carburized layer includes a high carbon content portion; and a low carbon content portion disposed between the metal nitride layer and the high carbon content portion, wherein the low carbon content portion has a smaller carbon content per unit area than a carbon content per unit area of the high carbon content portion. In one embodiment of the coating film, the high carbon content portion comprises titanium carbide (TIC).

In one embodiment of the coating film, an adhesion improving layer including titanium nitride (TiN) is further formed between the metal base and the metal nitride layer.

In one embodiment of the coating film, the carburized metal nitride includes a compound in which carbon is added, in a substitutional and/or interstitial manner, into the metal nitride.

In still another aspect of the present disclosure, there is provided a cutting tool including a metal base and a coating film on the metal base, wherein the coating film has high heat-resistance, high hardness and low friction, wherein the coating film includes: a metal nitride layer; and a carburized titanium-based nitride disposed on the metal nitride layer, wherein a surface portion of the carburized titanium-based nitride defines a high carbon content portion, wherein a low carbon content portion is disposed between the high carbon content portion and the metal nitride layer, wherein the low carbon content portion has a lower carbon content per unit area than a carbon content per unit area of the high carbon content portion.

Technical Effect

In accordance with the method for producing the coating film having high heat resistance, high hardness and wear resistance, the coating film having high heat-resistance, high hardness and wear resistance produced using the method, and the cutting tool including the same, as defined above, the thermal shock resistance, surface hardness and wear-resistance of the coating film can be improved. Further, when such a coating film is coated on the metal base, the life of the product made of the metal base can be extended.

BRIEF DESCRIPTION OF THE DRAWINGS

FIG. 3 shows XRD patterns of Present sample 1a and Comparative sample 1a.

FIG. 4 and FIG. 5 show results of wear-resistance characteristics of the Present sample 1a and Comparative sample 1a.

FIG. 6 is a diagram for illustrating the difference in carbon concentration between Present sample 1 and Comparative sample 1a.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
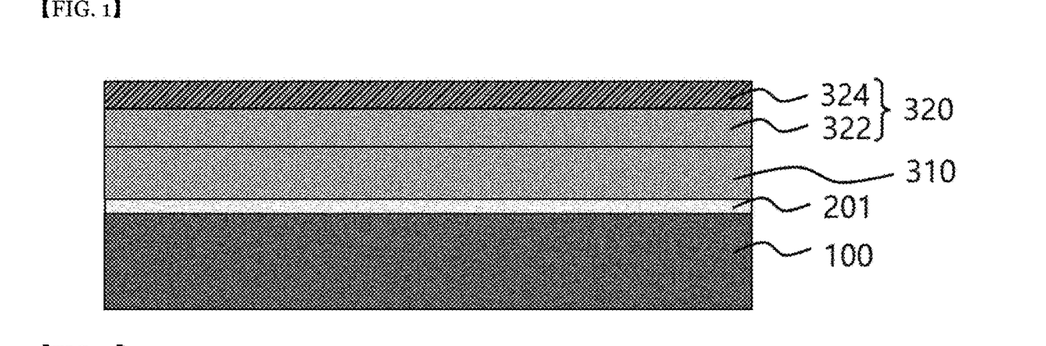
FIG. 1 is a cross-sectional view illustrating a coating film having high heat resistance, high hardness and wear resistance according to one embodiment of the present disclosure.

FIG. 1 is a cross-sectional view illustrating a coating film having high heat resistance, high hardness and wear resistance according to one embodiment of the present disclosure.

As shown in FIG. 1, according to the present disclosure, a coating film including a metal nitride layer 310 including a transition metal and a carburized layer 320 is formed on the surface of the metal base 100.

The metal base 100 is a metal base formed of a metal. The metal base 100 itself may be formed of a metal, or a top surface of the tool may be the metal base 100 by including a metal layer. The metal base 100 may be a cutting tool.

The coating film is formed on the surface of the metal base 100, and the metal nitride layer 310 can improve the heat resistance of the coating film. The metal nitride layer 310 of the coating film includes titanium (Ti) as a transition metal, and further includes zirconium (Zr) or chromium (Cr). The heat resistance of the entire coating film can be improved by the metal nitride layer 310.

In one embodiment, the metal nitride constituting the metal nitride layer 310 may be a compound represented by $Ti_{1-x}M_xN$ (0<x<1). In this connection, M represents Zr or Cr. In the case where the metal nitride layer 310 contains more zirconium or chromium, the lattice strain and the increase in bonds between zirconium, chromium and nitrogen atoms can improve the mechanical properties and heat resistance of the coating film 310 and 320 itself, compared to the case where the metal nitride layer 310 is a titanium nitride layer (including TiN).

The carburized layer 320 may be placed on the metal nitride layer 310, and, hence, the surface hardness and wear-resistance can be improved by the carburized layer 320. The carburized layer 320 may be a layer formed by carburizing carbon in the metal nitride, and the layer contains "carburized metal nitride". Further, the carburized layer 320 contains titanium carbide (TiC).

When the carbon (C) contained in the carburized layer 320 is replaced with the nitrogen (N) contained in the metal nitride, the carbon may be chemically bonded directly to metal (in a substituted manner), or the carbon (C) may invade into the metal nitride in an interstitial manner. The component of the carburized layer 320 composed of the metal nitride carburized in the substituted and/or interstitial manner may be expressed as $Ti_{1-x}M_x(C_yN_{1-y})$. In this connection, $0<x<1$, $0<y<1$. In this connection, $Ti_{1-x}M_x(C_yN_{1-y})$ means including at least one of nitride, carbide and nitride carbide. The carburized metal nitride may have an amorphous phase.

In the following, the carbon contained in the "content of carbon" is defined as including both the carbon inserted into the metal nitride in an interstitial manner and the carbon inserted into the metal nitride in the substituted manner.

For example, the carburized layer 320 may include a high carbon content portion 324 and a low carbon content portion 322.

The high carbon content portion 324 corresponds to the surface portion of the carburized layer 320 corresponding to the upper portion of the carburized layer 320 and substantially corresponds to the surface portion of the coating film. The carbon content in the high carbon content portion 324 is higher than the carbon content in the low carbon content portion 322 based on a unit area. In this connection, in terms of carbon content, the high carbon content portion 324 may be at least 1.5 times higher than the low carbon content portion 322.

The titanium carbide (TiC) contained in the carburized layer 320 is mainly contained in the high carbon content portion 324. In this connection, when the metal nitride layer 310 includes titanium and zirconium, the high carbon content portion 324 may be carburized metal nitride. In this case, the high carbon content portion 324 may further include at least one of titanium nitride, nitride titanium carbide, zirconium nitride, zirconium carbide, nitride zirconium carbide, titanium-zirconium nitride, titanium-zirconium carbide, nitride titanium-zirconium carbide, and interstitial carbon. When the metal nitride layer 310 includes titanium and chromium, the high carbon content portion 324 may further include at least one of titanium nitride, titanium carbide nitride, chromium nitride, chromium carbide, chromium carbide nitride, titanium nitride-chromium, carbon titanium-chromium, nitride carbide titanium-chromium and interstitial carbon. However, even when the high carbon content portion 324 include the above listed components, the titanium carbide (TiC) is significantly more abundant in the high carbon content portion 324 than these listed components. Thus, the titanium carbide (TiC) may act as a major component of the high carbon content portion 324.

The low carbon content portion 322 may be a layer interposed between the high carbon content portion 324 and the metal nitride layer 310. The low carbon content portion 322 includes the carburized metal nitride. The low carbon content portion 322 has a lower carbon content per unit area than that of the high carbon content portion 324.

In the present disclosure, the metal nitride layer 310 is based on titanium and further contains chromium or zirconium. This improves the mechanical properties and heat resistance of the coating film. The carburized layer 320 further contains carbon to allow adding a chemical bond between the titanium and the carbon, such that the mechanical properties of the coating film can be improved.

In one embodiment, an adhesion improving layer 201 may be disposed between the coating film and the metal base 100. The adhesion improving layer 201 may include titanium nitride (TiN) and may be interposed between the metal base 100 and the metal nitride layer 310. The adhesion improving layer 201 can improve the adhesion between the coating film and the metal base 100.

As described above, as the coating film including the metal nitride layer 310 and the carburized layer 320 is formed on the surface of the metal base 100, surface hardness and wear-resistance the metal base 100 can be improved in addition to the improvement of the heat resistance of the metal base 100.

Hereinafter, referring to FIG. 2, a method of forming the coating film illustrated in FIG. 1 on the surface of the metal base 100 will be specifically described.

Figure 2:
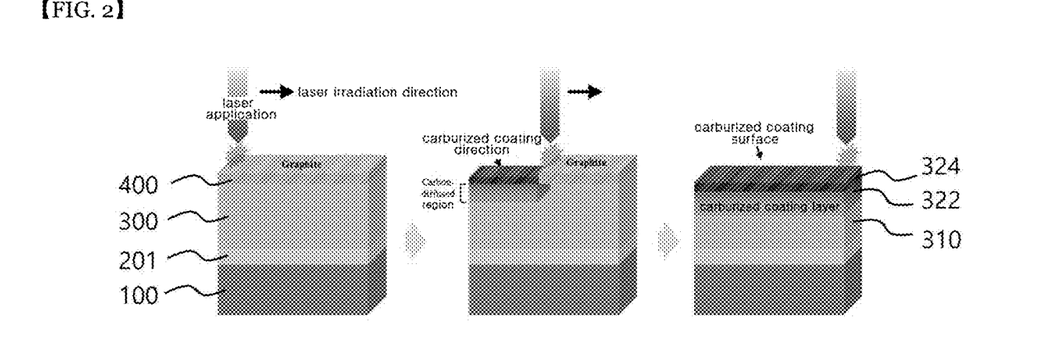
FIG. 2 is a diagram for illustrating a method of forming the coating film of FIG. 1.

FIG. 2 is a diagram for illustrating the method of forming the coating film of FIG. 1.

Referring to FIG. 2 with FIG. 1, First, an adhesion improving layer 201 and a nitride layer 300 are formed on a metal base 100. A carbon layer 400 is formed on the metal base 100 where the nitride layer 300 is formed.

Specifically, a titanium layer is first formed on the metal base 100, and the nitride layer 300 is formed on the metal base 100 on which the titanium layer is formed.

As the metal base 100, SUS or WC—Co (tungsten carbide-cobalt) base may be used.

Titanium and a transition metal are provided as a target material for the formation of the nitride layer 300. At the same time, nitrogen gas is supplied. The supplied nitrogen gas may allow the titanium layer to turn into titanium nitride (TiN) when the titanium is nitrided. Thus, the adhesion improving layer 201 may be formed. The composition of the formed nitride layer is substantially the same as the metal nitride layer 310 containing the transition metal as illustrated in FIG. 1. A portion of the nitride layer 300 is carburized and the remainder remains, thereby to from the metal nitride layer 310.

The nitride layer 300 may be formed by physical vapor deposition, for example, by RF/DC magnetron sputtering.

In one embodiment, a separate formation of the adhesion improving layer 201 is omitted. The surface of the metal base 100 may be cleaned and then the surface of the cleaned metal base 100 may be treated to improve adhesion of the surface to the nitride layer 300 formed thereon. The surface treatment may be performed using ion bombardment.

The cleaning process may be performed using ethanol and/or acetone, and can be performed at least once.

The nitride layer 300 as a sintered compound target may be deposited on the metal base 100 surface using arc discharge technique sputtering. During the deposition process, the temperature of the metal base 100 may be maintained at between 330° C. and 370° C. for grain growth in the nitride layer 300.

The components of the nitride layer 300 thus formed substantially include titanium as shown in FIG. 1 and thus may be the same as the metal nitride layer 310 further comprising zirconium or chromium. A portion of the nitride layer 300 is carburized and the remainder remains, thereby to become the metal nitride layer 310.

After forming the nitride layer 300, the carbon layer 400 is formed thereon.

A carbon paste includes carbon materials, binders and solvents. graphite or carbon nanotubes (CNTs) may be used as the carbon material. The carbon material may be distributed in a mixture of a binder and a solvent to form a carbon paste. When the carbon paste contains graphite, it is preferable to use the graphite having a size of 20 um or smaller. When the carbon paste includes graphite having a size of 20 um or smaller, there is an advantage that the mechanical properties of the coating layer can be remarkably improved as compared with the case of using a larger size of graphite.

The binder may be polyvinylidene difluoride (PVDF). The solvent may be N-methyl-2-pyrrolidone (NMP). The weight ratio of the carbon material and PVDF is 90:10, and the viscosity can be controlled by adding a small amount of the solvent.

The coating process may be performed by spraying a carbon paste (spray process) or applying the carbon paste evenly with a brush or spatula (brushing process). The carbon layer 400 may be formed by drying the paste. The drying process may be carried out at a temperature of 100° C. to 1500° C. for 15 minutes to 1 hour. The drying process may allow the adhesion of the carbon layer 400 to be improved to prevent the carbon layer 400 from being peeled from the surface of the nitride layer 300. Further, in a subsequent carburizing process using a laser ablation, the risk of dispersing the carbon layer 400 in the liquid phase may be avoided. At the same time, there is an advantage that even when the carbon paste is not evenly applied, the surface of the carbon layer 400 may be smoothed via the drying process of the carbon layer 400.

The carburizing process may be performed by using laser in the state in which the carbon layer 400 is formed. The carburizing process may be done via the laser ablation. In this process, carbon in the carbon layer 400 becomes a carbon source to be injected into the nitride layer 300, Then, carburization occurs by the laser irradiation.

Specifically, the carburizing process may be performed while the laser is directed in one direction from one end to the other end of the metal base 100. This process may be performed at least once. The laser may be realized by pulse or continuous wave. When using the pulsed laser, the frequency band from 3 Hz to 20 Hz may be specified. By controlling the output of the laser and/or the number of times the laser is irradiated, in addition to controlling the frequency, the thickness of the carburized layer 320 and the carbon content of the carburized layer 320 may be determined.

In the laser-irradiated region, the carbon is diffused into the carburized coating surface and then the nitride layer 300 underneath the carburized coating surface. This results in the carburized coating layer including the low carbon content portion 322 and the high carbon content portion 324 covering the low carbon content portion 322. A portion of the nitride layer 300 remains as the metal nitride layer 310 as illustrated in FIG. 1. Further, the high carbon content portion 324 and the low carbon content portion 322 constitute the carburized layer 320. The carburized layer 320, together with the metal nitride layer 310 may constitute the coating film that protects the surface of the metal base 100 and improves the mechanical properties of the metal base 100.

After performing the carburizing process, a cleaning process may be performed to remove the remaining carbon layer 400. The cleaning process may be performed by ultrasonic cleaning using a solvent. For example, the cleaning process may be carried out by first washing with ethanol and second washing using acetone, and then the first and second washing may be repeated.

Since, according to the above configuration, the coating film including the metal nitride layer 310 and the carburized layer 320 is formed on the surface of the metal base 100, the surface hardness and wear-resistance in addition to the heat resistance of the metal base 100 can be improved.

In the following, we will give more details about the improvement of surface hardness and wear-resistance via concrete producing examples and samples made by the producing examples, and comparative samples.

Producing Example: Preparation of Present Sample 1a

A thin Ti layer was formed on SUS304 as a metal base, and then $Ti_{0.7}Zr_{0.3}N$ was deposited to a thickness of 3.0 μm under the deposition conditions shown in Table 1 below. In the step of forming the $Ti_{0.7}Zr_{0.3}N$ layer, the Ti layer is converted into TiN by the provided nitrogen gas. Then, $Ti_{0.7}Zr_{0.3}N$ was formed on the TiN.

TABLE 1

| | |
|---|---|
| Ti:Zr ratio (at. %) of target materials | 70: |
| Base pressure (Torr) | $1.0 \times 10^{-5}$ |
| Working pressure (Torr) | $1.0 \times 10^{-2}$ |
| RF power (W) | 200 |
| Deposition temperature (K) | 723 |
| Deposition time (h) | 6.0 |
| Rotational velocity of substrate (rpm) | 15 |
| Ar:N2 gas ratio | 5:1 |
| Coating thickness (μm) | 3.0 |

A carbon paste was applied on the SUS304 having the $Ti_{0.7}Zr_{0.3}N$ layer formed thereon by a spatula (hand-brushing), to form a graphite layer having a thickness of 0.2 mm. The carbon paste for producing the carbon layer was obtained by mixing graphite a size of 20 micrometers and PVDF at a weight ratio of 90:10 with NMP as a solvent for viscosity control. After the coated graphite layer is dried at 130° C. for about 10 minutes, a scanning step of irradiating the laser in one direction with 60% output and a frequency of 5 Hz was performed ten times using LSX-213 (trade name, CETAC technologies) using Nd-YAG as a light source.

The remaining carbon layer was then removed via an ultrasonic cleaning process using ethanol and acetone, respectively. As a result, a Present sample 1a according to one example of the present disclosure was prepared.

Preparation of Comparative Sample 1a

A Comparative sample 1a where no carburized layer was formed was prepared by sequentially forming a TiN layer and a $Ti_{0.7}Zr_{0.3}N$ layer on the SUS304. The TiN layer and the $Ti_{0.7}Zr_{0.3}N$ layer were fabricated in substantially the same manner as in the production of the Present sample 1a.

Structure Analysis-1: XRD Analysis

XRD analysis was performed on each of Present sample 1a and Comparative sample 1a. The results are shown in FIG. 3.

Figure 3:
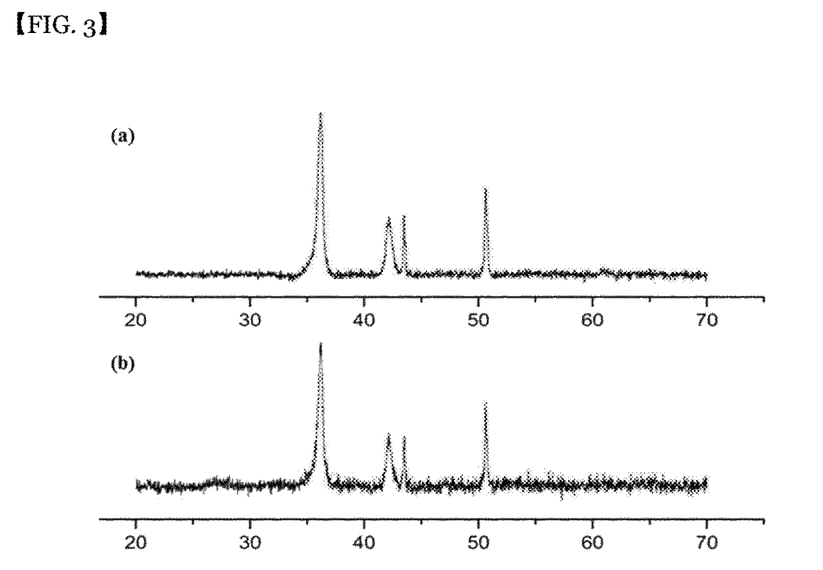

FIG. 3 shows the XRD patterns of Present sample 1a and Comparative sample 1a.

In FIG. 3, (a) shows the XRD pattern of the Comparative sample 1, (b) shows the XRD pattern of the Present sample 1a. In (a) and (b), the x-axis represents the diffraction angle (2θ, unit °).

Referring to FIG. 3, it may be seen that both the Present sample 1a and the Comparative sample 1a show a main peak at the same diffraction angle. As a result, it may be confirmed that the main peak does not change by laser ablation. However, in the case of the Present sample 1a in which the graphite layer was formed and laser ablation was performed, more noise is generated over the entire area compared with the Comparative sample 1a. This noise generation may indicate that amorphization is expected to occur on the surface via carburization by the laser irradiation and laser ablation in the production of Present sample 1a. It may be seen that the amorphization improves the mechanical properties of the coating layer.

Characteristic Evaluation—1: Hardness

The comparative samples 1b to 1e were prepared by substantially the same process as the preparation of the Comparative sample 1a. Knoop hardness (HK) was measured for each of the comparative samples 1b to 1e.

Further, the laser was repeatedly irradiated 20 times to each of the comparative samples 1b to 1e at an output of 50% and a frequency of 5 Hz. Thus, Present Samples 2-1, 3-1, 4-1 and 5-1 were respectively prepared. Then, Knoop hardness was measured for these samples 2-1, 3-1, 4-1 and 5-1. Further, Present Samples 2-2, 3-2, 4-2 and 5-2 were respectively prepared by repeatedly irradiating the comparative samples 2 to 5 with the laser 10 times at a frequency of 10 Hz and an output of 60%. Then, Knoop hardness was measured for these samples 2-2, 3-2, 4-2 and 5-2.

The results are shown in Table 2. The knoop hardness was measured 12 times for each sample, and the average of ten hardness values except the maximum/minimum values was displayed as below:

TABLE 2

| Samples | Knoop hardness(HK) |
| --- | --- |
| Present sample 2-1 | 2716.62 |
| Present Sample 3-1 | 2770.55 |
| Present Sample 4-1 | 2819.07 |
| Present Sample 5-1 | 2826.46 |
| Present sample 2-2 | 2863.18 |
| Present Sample 3-2 | 2873.93 |
| Present Sample 4-2 | 29.41 |
| Present Sample 5-2 | 02.03 |
| Comparative sample 1b | 2467.47 |
| Comparative sample 1c | 2520.65 |
| Comparative sample 1d | 2524.63 |
| Comparative sample 1e | 2633.60 |

Table 2 shows that the hardness results of Present sample 2-1 to 5-1 and Present sample 2-2 to 5-2 are higher than those of Comparative sample 2 to 5. The number average of Present sample 2-1 to 5-1 is 2783.18, and the number average of Present sample 2-2 to 5-2 is 2917.39, while the number average of Comparative sample 2 to 5 is 2536.59. Thus, it may be seen that the hardness of Present sample 2-1 to 5-2 as subjected to the laser ablation is higher than the hardness of Comparative sample 2 to 5.

In particular, the average value of Present sample 2-2 to 5-2 is increased by about 15% as compared with that of Comparative sample 1b to 1e. That is, it may be confirmed that the surface hardness is improved by producing the carburized layer via the laser ablation and laser irradiation.

Characteristic Evaluation—2: Wear-Resistance Characteristic Evaluation

For each of the Present sample 1a and the Comparative sample 1a, a ball-on-disk experiment was performed to evaluate the wear-resistance characteristic. The results are shown in FIG. 4 and FIG. 5.

Figure 4:
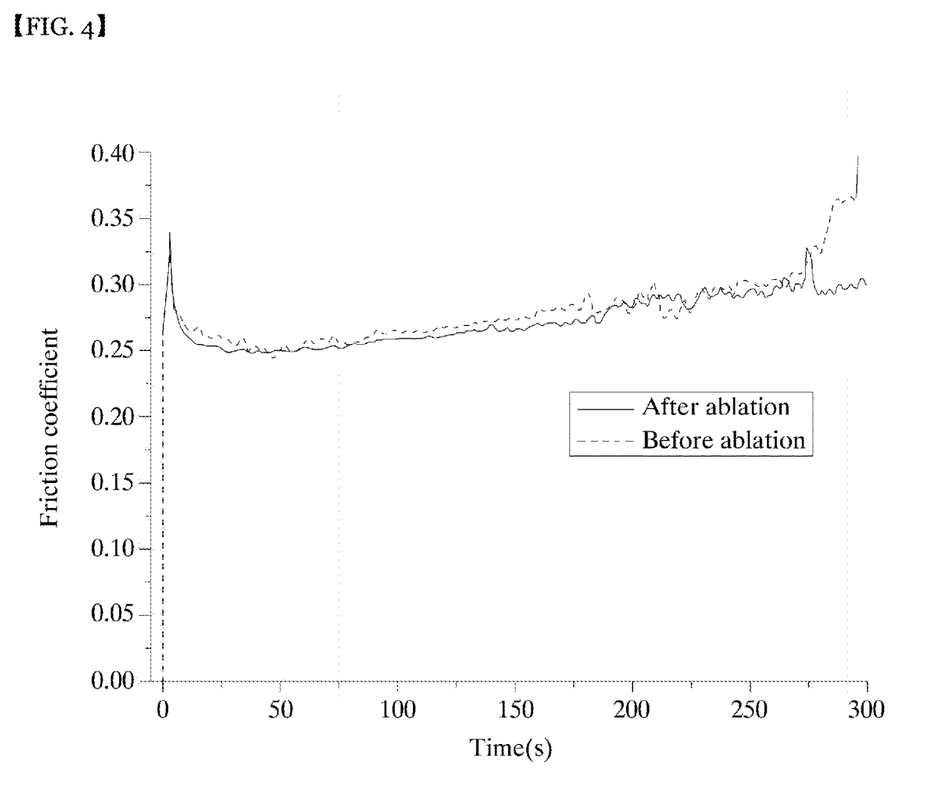
Figure 5:
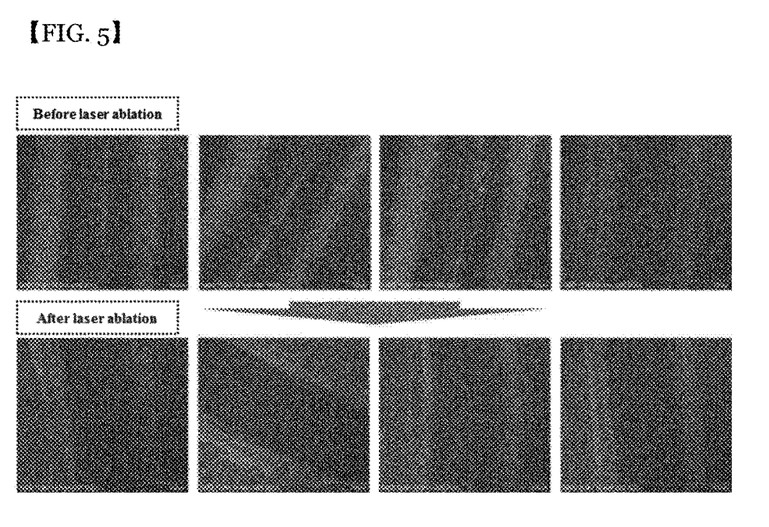

FIG. 4 and FIG. 5 show the wear-resistance characteristic results of Present sample 1a and Comparative sample 1a. In FIG. 4 and FIG. 5, "After ablation" is for Present sample 1a, while "Before ablation" is for Comparative sample 1. FIG. 4 is a graph showing the change in friction coefficient based on the number of experiments. FIG. 5 shows SEM photographs showing the change in wear behavior. In FIG. 4, the x-axis represents the number of experiments, and the y-axis represents the friction coefficient.

As shown in FIG. 4, the friction coefficient of Present sample 1a shows a tendency to decrease as the number of experiments increases. Particularly, in the case of the comparative sample 1a, an abrupt increase of the friction coefficient occurs at around 270 seconds. In the present sample 1a, the coefficient of friction is kept constant without any change. That is, in the case of the comparative sample 1a, the wear and deterioration results are shown. It may be seen that in the case of Present sample 1a, wear resistance is significantly increased as compared with Comparative sample 1a.

As shown in FIG. 5, after the wear-resistance test, the track shown in each of the Present sample 1a and the Comparative sample 1a was observed. It is confirmed that, in the case of Present sample 1a, the surface destruction phenomenon in the track is remarkably reduced as compared with Comparative sample 1a.

Therefore, it may be seen from the results of FIG. 4 and FIG. 5 that wear-resistance is remarkably improved when the laser is irradiated via laser ablation and the carburized layer is formed.

Component Analysis and Results

For each of Present sample 1a and Comparative sample 1a, Dynamic SIMS was performed to confirm the difference in carbon concentration in the carburized layer. The results are shown in FIG. 6.

Figure 6:
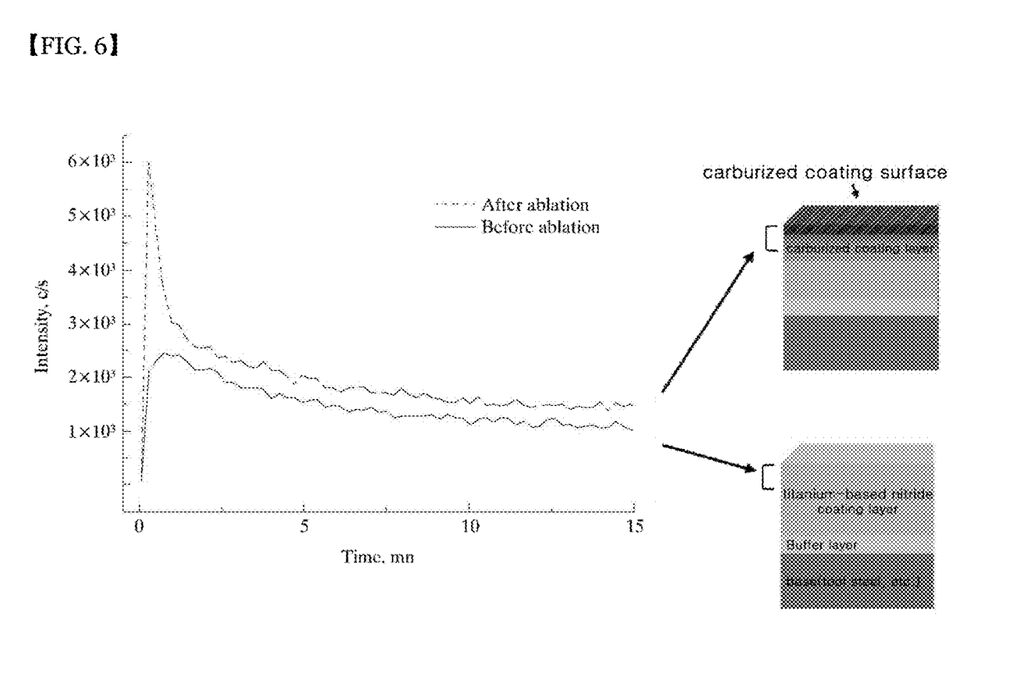

FIG. 6 shows the difference in carbon concentration between Present sample 1a and Comparative sample 1a.

In FIG. 6, the x-axis represents the distance, or depth from the surface to the measurement point. The intensity of the y-axis represents the concentration of carbon. "After ablation" refers to Present sample 1a, while "Before ablation" refers to Comparative sample 1a.

FIG. 6 shows that the carbon concentration on the surface of Present sample 1a is generally higher than the carbon concentration on the surface of Comparative sample 1a. In particular, it may be confirmed that in present sample 1a, the carbon content in the surface increases. As a result, in the case of Present sample 1a, the carburized layer is formed, and, hence, the presence of TiC in the carbonized surface portion of the carburized layer significantly increases the carbon content. It can be expected that the mechanical characteristics of the Present sample 1a are improved due to the formation of such a carburized layer, as compared to the comparative sample 1.

Producing Example: Manufacture of Present Sample 1b

The atomic ratio of Ti and Zr in the target material was 50:50, and $Ti_{0.5}Zr_{0.5}N$ layer was formed using this composition ratio. With the exception of this configuration, Present sample 1b according to the present disclosure was manufactured using substantially the same process as the present sample 1a.

Manufacture of Present Sample 1c

Except for using carbon nanotubes instead of graphite for the carbon paste, Present sample 1c was prepared by substantially the same process as that of Present sample 1a.

Producing Example: Manufacture of Present Sample 2

Except for using the spray process instead of the brushing process in the process of forming the carbon layer, Present sample 2 according to the present disclosure was prepared via substantially the same process as that of Present sample 1a.

Production of Comparative Sample 2

TiN layer and $Ti_{0.5}Zr_{0.5}N$ layer were sequentially formed on SUS304. Thus, a comparative sample 2 having no carburized layer was prepared. The TiN layer and $Ti_{0.5}Zr_{0.5}N$ layer were fabricated in the same manner as in Present sample 1b.

Analysis of Structural Changes Between Manufacturing Processes

EXAFS analysis (Extended X-ray absorption fine structure analysis) was performed for the structural analysis between the manufacturing process of each of Present sample 1b and Present sample 1c. The results are shown in FIG. 7.

Figure 7:
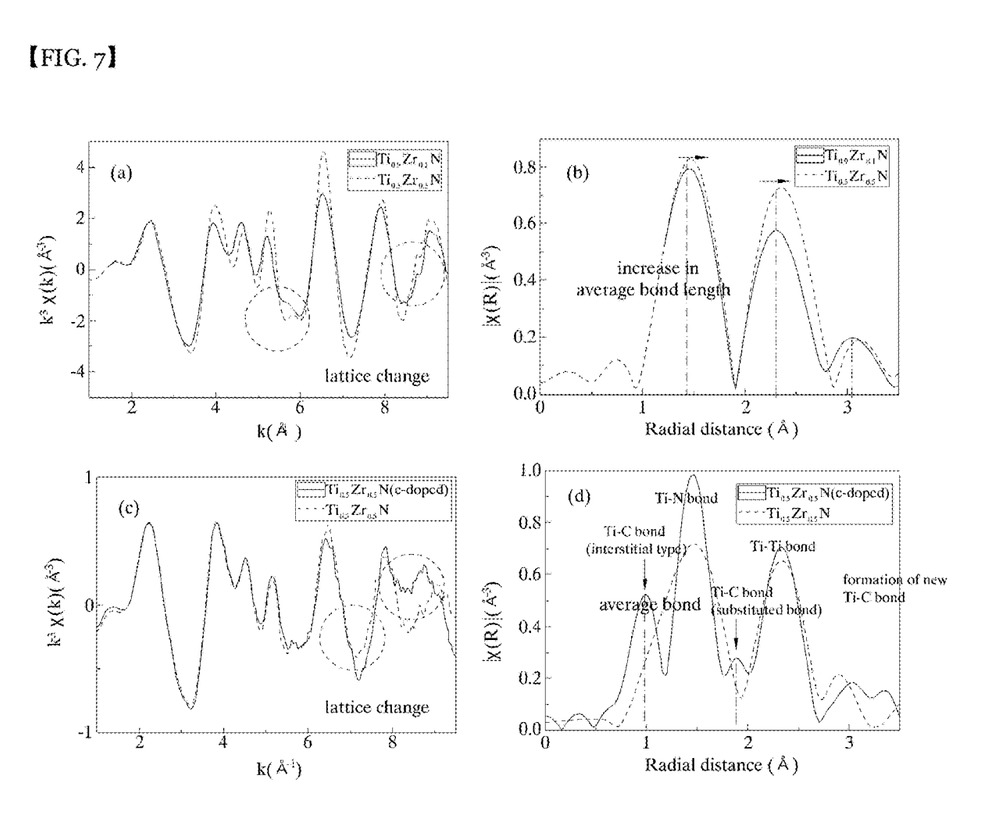
FIG. 7 is a diagram for illustrating structural analysis results associated with manufacturing process of the Present sample 1b according to the present disclosure.

FIG. 7 is a diagram for illustrating the result of the structural analysis between the manufacturing processes of Present sample 1b according to the present disclosure.

In FIG. 7, (a) and (b) show data for titanium-zirconium nitride before carbon is added. (a) shows $k^3\chi$ EXAFS data at Ti K-edge, and (b) shows Fourier transform EXAFS data at Ti K-edge. (c) shows $k^3\chi$ EXAFS data at Ti K-edge before and after addition of carbon to titanium-zirconium nitride. (d) shows Fourier transform EXAFS data before and after addition of carbon to titanium-zirconium nitride.

Referring to FIGS. 7 (a) and 7 (b), when $Ti_{0.9}Zr_{0.1}N$ and $Ti_{0.5}Zr_{0.5}N$ are compared to each other, following is confirmed: as the content of zirconium increases, the lattice strain becomes larger. It may be seen that the overall average bond length increases due to the combination of zirconium and nitrogen.

Further, referring to (c) and (d) of FIG. 7, it may be seen that for $Ti_{0.5}Zr_{0.5}N$, due to the addition of carbon, another lattice strain may be different from that in (a). As the content of zirconium increases, lattice strain increases. Referring to (d), it may be confirmed that the addition of carbon forms a titanium-carbon bond between the interstitial carbon and the substitutional carbon and titanium. That is, titanium-carbon bonds exist in the carburized layer, and, the presence of interstitial carbon improves the mechanical properties of the coating layer.

Characteristic Evaluation—3

For each of present samples 1b, 1c, 2 and comparative sample 2, the surface friction coefficient characteristic was evaluated by ball-on-disk experiment for wear-resistance characteristic evaluation. Further, to observe the microstructure of the track after the wear-resistance characteristic evaluation, SEM photographs were taken for each of present sample 1b and present sample 1c. The results are shown in FIG. 8.

Figure 8:
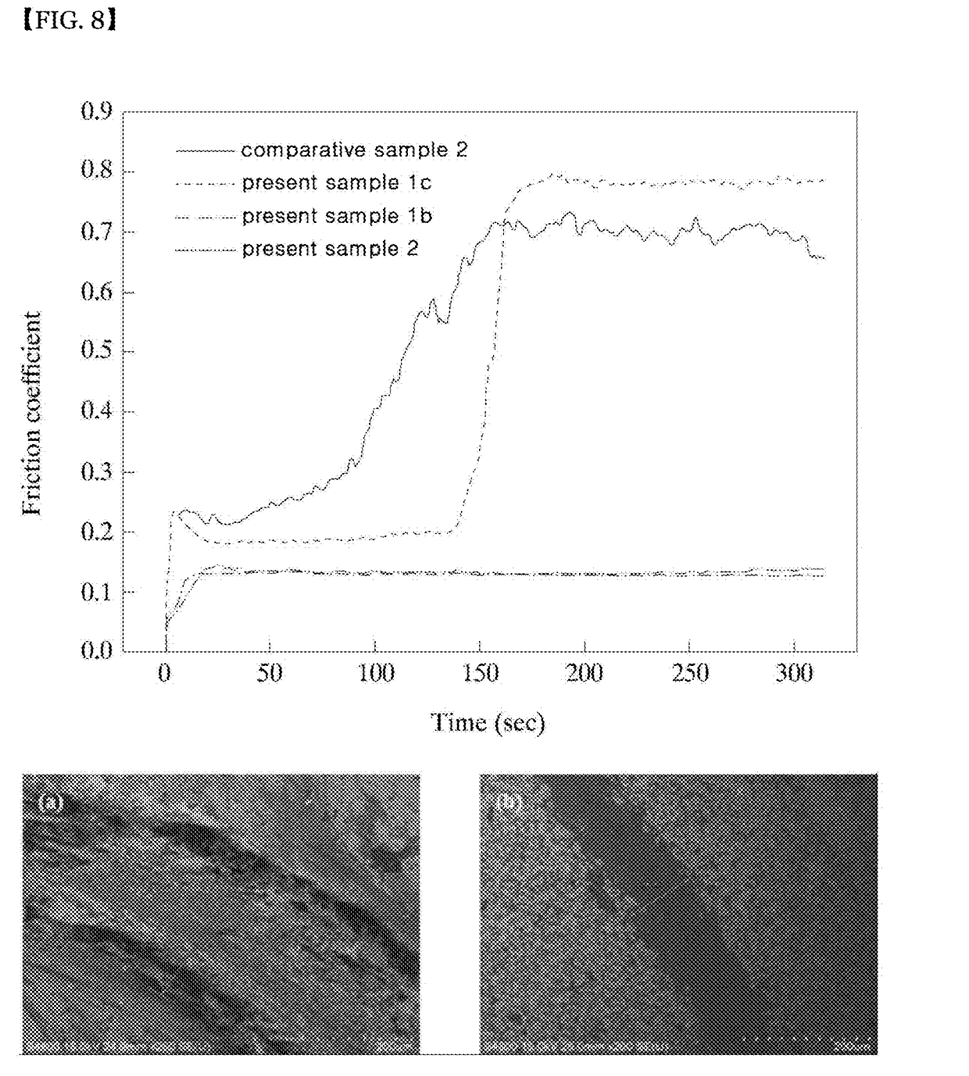
FIG. 8 shows graphs and photographs for illustrating surface friction coefficient characteristics of the Samples 1b, 1c, 2 and Comparative sample 2 according to the present disclosure.

FIG. 8 shows graphs and photographs to illustrate the surface friction coefficient characteristic results of Present sample 1b, 1c, 2 and Comparative sample 2 according to the present disclosure.

In the graph in FIG. 8, the x-axis represents the time (in seconds) and the y-axis represents the friction coefficient. Further, among the SEM images of FIG. 8, (a) is for Present sample 1c and (b) is for Present sample 1b.

Referring to FIG. 8, even though the experiment time increases, the friction coefficient of present sample 1b and Present sample 2 using graphite is substantially unchanged. Further, even in Present sample 1c, the friction coefficient increases after 100 seconds. Before 100 second, there is practically no change. On the other hand, in the case of the comparative sample 2 not including the carburized layer, the friction coefficient gradually increases from 30 seconds, and the friction coefficient increases abruptly in the vicinity of 100 seconds. That is, in the case of Comparative Sample 2, deterioration occurs at a maximum of about 50 seconds. In the case of present sample 1c, deterioration occurs after 150 seconds. In case of present sample 1b or 2, it may be confirmed that even when the time elapses up to 300 seconds, there is no substantial change.

Producing Example: Manufacture of Present Samples 3 and 4

WC—Co was used as a metal base instead of SUS304. Instead of zirconium, chromium was used. With the exception of this configuration, Present Sample 3 was manufactured by performing substantially the same process as Present sample 1b.

Further, except for using chromium instead of zirconium, Present Sample 4 was prepared by performing substantially the same process as Present sample 2.

Preparation of Comparative Sample 3

Except that WC—Co was used as the metal base instead of SUS304, Comparative sample 3 without the carburized layer was prepared by carrying out substantially the same process as Comparative sample 2.

Characteristic Evaluation—4

For each wear-resistance characteristic evaluation of Present Samples 3 and 4 and Comparative Sample 3, the surface friction coefficient characteristic was evaluated by ball-on-disk experiment. Further, to observe the microstructure of the track after the wear-resistance characteristic evaluation, scanning electron microscope (SEM) photographs were taken for each of the comparative sample 3 and the present sample 3. The results are shown in FIG. 9.

Figure 9:
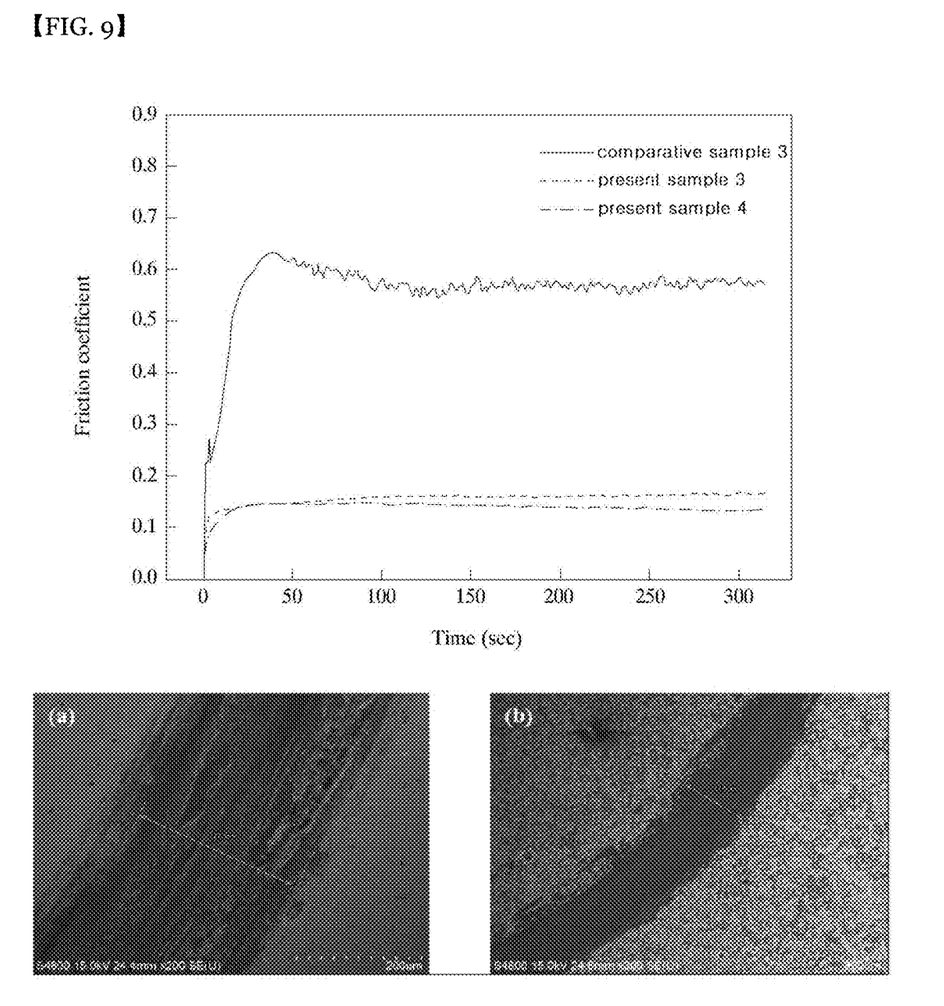
FIG. 9 shows graphs and photographs for illustrating surface friction coefficient characteristic results of Samples 3 and 4 and Comparative Sample 3 according to the present disclosure.

FIG. 9 shows graphs and photographs to illustrate the surface friction coefficient characteristic results of Present Sample 3, 4 and Comparative Sample 3 according to the present disclosure.

In FIG. 9, the graph shows the surface friction coefficient characteristic for Present Sample 3, 4 and Comparative Sample 3. SEM photograph (a) is for comparative sample 3, and (b) is for Present Sample 3.

Referring to the graph of FIG. 9, in the case of the comparative sample 3, there occurs a rapid deterioration. Present Samples 3 and 4 show that there is no substantial change over time. That is, it may be confirmed that, when carbon is added to the titanium-chromium nitride in an interstitial and/or substitutional manner, the tendency thereof is similar to that of the titanium-zirconium nitride.

Further, referring to the SEM photographs (a) and (b) of FIG. 9, it may be seen that the destruction of the coating layer in Present Sample 3 is remarkably reduced.

Although the present disclosure is illustrated above with reference to preferred embodiments of the present disclosure, it will be understood by those skilled in the art that various changes in form and details may be made thereto without departing from the spirit and scope of the present disclosure as set forth in the following claims.

What is claimed is:

1. A method for producing a coating film having high heat resistance, high hardness and wear resistance, the method comprising:

forming a metal nitride layer on a metal base;

forming a dried carbon layer on the metal nitride layer; and irradiating a laser into the dried carbon layer to add carbons into a portion of the metal nitride layer, thereby to form a carburized layer, wherein the metal nitride layer includes titanium (Ti) and at least one of zirconium (Zr) and chromium (Cr), and wherein the carburized layer includes a compound in which carbon is added in a substitutional manner, into the metal nitride to form a compound expressed as $Ti_{1-x}M_x(C_yN_{1-y})$ ($0<x<1$, $0<y<1$), wherein M is Zr or Cr.

2. The method of claim 1, wherein forming the carburized layer includes irradiating a pulse or continuous wave laser into the carbon layer.

3. The method of claim 1, wherein the carburized layer includes titanium carbide (TiC).

4. The method of claim 1, wherein the carburized layer includes:

a high carbon content portion; and a low carbon content portion disposed between a portion of the metal nitride layer remaining after the carburization and the high carbon content portion, wherein the low carbon content portion has a smaller carbon content per unit area than a carbon content per unit area of the high carbon content portion.

5. The method of claim 4, wherein the high carbon content portion comprises titanium carbide (TiC).

6. The method of claim 1, wherein the method further comprises removing a portion of the carbon layer remaining after forming the carburized layer.

7. The method of claim 1, wherein the carbon layer is made of graphite or carbon nanotube (CNT).

8. The method of claim 1, wherein forming the carbon layer includes coating a carbon paste containing a carbon material, a binder and a solvent on the metal nitride layer.

9. The method of claim 8, wherein when the carbon material is graphite, a size of graphite is 1 nm or larger, and is 20 μm or smaller.

10. The method of claim 1, wherein the method further includes forming a titanium layer on the metal base prior to forming the metal nitride layer, wherein in forming the metal nitride layer, the titanium layer is nitrided to form an adhesion improving layer made of titanium nitride (TiN).

* * * * *